Oct. 12, 1965 H. FLEISCHMANN 3,211,655

MIXED-CRYSTAL THERMOELECTRIC COMPOSITIONS

Filed July 25, 1962

United States Patent Office 3,211,655

Patented Oct. 12, 1965

3,211,655

MIXED-CRYSTAL THERMOELECTRIC COMPOSITIONS

Horst Fleischmann, Erlangen, Germany, assignor to Siemens-Schuckertwerke Aktiengesellschaft, Berlin-Siemensstadt, Germany, a corporation of Germany Filed July 25, 1962, Ser. No. 212,412

Claims priority, application Germany, July 29, 1961, S 75,092

6 Claims. (Cl. 252—62.3)

Figure 1:
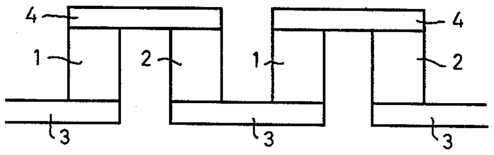
Figure 2:
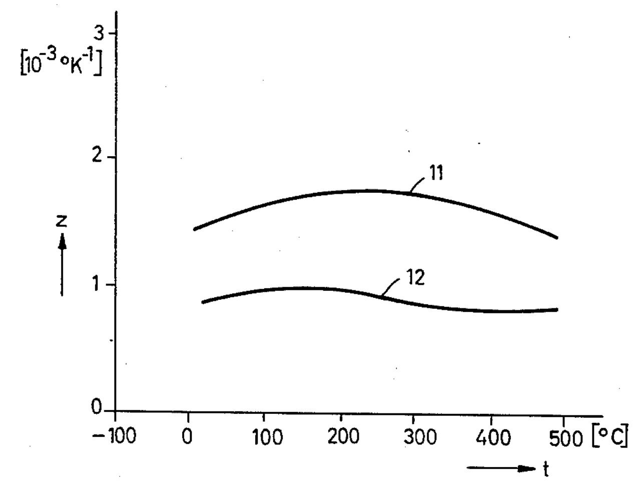
Figure 3:
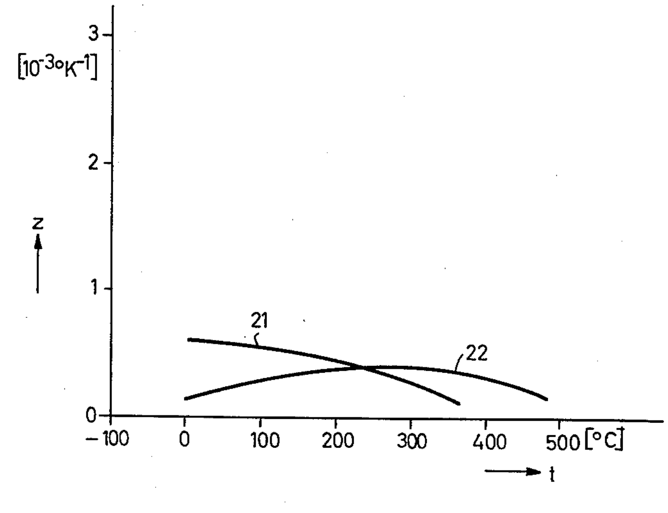

My invention relates to mixed-crystal semiconductor devices and is described herein with reference to the accompanying drawings in which FIG. 1 shows schematically an example of a semiconductor thermocouple and FIGS. 2 and 3 are graphs indicative of characteristic properties exhibited by crystalline compositions used as semiconductors in such devices, in accordance with my invention.

In a more specific aspect, my invention concerns semiconductor devices which comprise a semiconductor body constituted by a mixed-crystal of an $A^{IV}B^{VI}$ compound and of an $A^{I}B^{V}C_2^{VI}$ compound, these binary and ternary terminal compounds being of the intermetallic type and composed of element from the b-groups of the periodic system identified by the superscripts I, IV, V and VI. It is known that the $A^{IV}B^{VI}$ compounds are suitable for technological utilization of the Peltier effect in the electric production of cold. On the other hand, ternary compounds of the type $A^{I}B^{V}C_2^{VI}$, for example $AgSbTe_2$, have also become known as suitable for similar purposes.

As is disclosed in the copending application Serial No. 856,087, filed November 30, 1959, by O. Folberth, which issued as Patent No. 3,140,998 on July 14, 1964 and is assigned to the assignee of the present invention, the properties of the above-mentioned groups of compounds can be combined by mixed-crystal formation with the result of improving their suitability for thermoelectric purposes. For example, the thermal conductance can thus be reduced to values lower than those obtainable with the respective terminal compounds. Particularly favorable results in this respect have heretofore been obtained by partially substituting one or more of the individual mixed-crystal components by another component from the same b-group of the periodic system. In the most general case, the formula of such a mixed-crystal, as stated in the above-mentioned copending application, is as follows:

$$[(A^{I}_{xy/2}\ B^{I}_{x/2(1-y)})(C^{IV}_{(1-x)z}\ D^{IV}_{(1-x)(1-z)})(E^{V}_{xt/2}\ F^{V}_{x/2(1-t)})][G^{VI}_{u}\ H^{VI}_{1-u}]$$

It is an object of my invention to further improve multi-component mixed-crystal semiconductor devices toward increasing the ratio of thermal to electrical conductance and thus the thermoelectric effectivity beyond the magnitudes heretofore attained and expectable.

I have discovered that such improvements are achieved according to a feature of my invention, by forming a semiconductor body, predicated upon the general concepts explained in the foregoing, from two $A^{IV}B^{VI}$ compounds and one $A^{I}B^{V}C_2^{VI}$ compounds in accordance with the formula:

$$(A^{I}_{x/2}\ B^{IV}_{(1-x)(1-y)}\ C^{IV}_{(1-x)y}\ D^{V}_{x/2})E^{VI},\ 0<x,y<1$$

It will be understood that the values of $x$ and $y$ in this formula must be appreciably greater than zero and appreciably smaller than unity so that a true five-component mixed-crystal is obtained whose thermoelectrically signifcant properties, discussed hereinbelow, are distinct from the corresponding properties of the terminal compounds. In the composition all components are taken from the b-groups of the periodic system, namely the first, fourth, fifth and sixth b-groups as identified by the Roman superscripts in the formula, and the composition of the mixed-crystal is stoichiometric in the sense that the number atoms from component E appertaining to group VIb of the periodic system is substantially equal to the sum of the atoms of all other four components.

The presence of two binary compounds of the type $A^{IV}B^{VI}$ in the mixed-crystal corresponds to a further mixed-crystal formation involving a complete or partial substitution of the elements from the fourth and six groups by elements from the same respective groups of the periodic system, compared with the above-mentioned general formula according to the copending application Serial No. 856,087. However, it has been ascertained that for reliably securing the desired considerable improvement the element from the group Ib is preferably silver, the elements from group IVb are to be selected from Sn and Pb, the element from Vb is to be selected from Sb and Bi, and the element from group VIb is to be selected from Se and Te.

It has further been found that the minimum value of $x$ at which an improved thermoelectric effectivity is observed, is at about 0.4, although in some cases it may be at about 0.35, and that the value for $x$ must stay below 0.95. In contrast, the value for $y$ may vary within the wider limits of 0.05 to 0.95.

Preferred examples of mixed-crystals according to the invention are the following:

$(Ag_{x/2}Pb_{(1-x)(1-y)}Sn_{(1-x)y}Sb_{x/2})Te$, $0.4<x<1$ and $0<y<1$ $(Ag_{x/2}Pb_{(1-x)(1-y)}Sn_{(1-x)y}Bi_{x/2})Te$, $0.4<x<1$ and $0<y<1$ Semiconductor devices according to the invention, although applicable for other electronic purposes, are of particular advantage for use in thermoelectric devices. For attaining a high efficiency in thermoelectric energy or cold production, the properties of the thermoelectric materials must be such that the value of the so-called thermoelectric effectivity $$z=\frac{\alpha^2\cdot\sigma}{\kappa}$$

becomes as great as possible. In the formula:

$\alpha$=absolute thermoforce (Seebeck coefficient),
$\sigma$=electric conductivity,
$\kappa$=heat conductance.

With metals and metal alloys the thermoelectric effectivity is at best about $z=10^{-4}$ ° K.$^{-1}$. This corresponds to an efficiency of 1% at a temperature difference of 500° K. With semiconducting compounds, however, values of $z=10^{-3}$ ° K.$^{-1}$ and, under comparable conditions, an efficiency degree of about 10% have been reached.

In the search for best suitable semiconducting materials, the attainment of high effectivity $z$ is predicated essentially upon a largest possible ratio of thermal to electrical conductance $\sigma/\kappa$, since the thermoforce is not a constant coefficient of the material. In semiconductors, the electric conductance $\sigma$, as well as the absolute thermoforce $\alpha$, can be greatly varied percentagewise, but is dependent upon the particular material because of its proportionality to the electric charge-carrier mobility. It is known that the ratio $\sigma/\kappa$ can be increased by mixed-crystal formation relative to the terminal compounds. In general, mixed-crystal formation results in greatly reducing the thermal conductance $\kappa$, whereas the electrical conductance $\sigma$ does not much depart from the average value resulting from the respective values of the terminal compounds.

In this respect, however, mixed-crystals according to the invention have been found to be superior to the mixed-crystals heretofore known and to result in better thermoelectric effectivities than expected.

It has been discovered that the ratio $\sigma/\kappa$ is indeed amenable to further increase by continuing the mixed-crystal formation in the sense of the present invention. The increase is obtained, for example, by substituting in a mixed-crystal, such as $(Ag_{0.4}Pb_{0.2}Sb_{0.4})$ Te, the Pb component partially by Sn, thus arriving for example at the composition $(Ag_{0.4}Pb_{0.1}Sn_{0.1}Sb_{0.4})$ Te. The same applies to the mixed-crystal series $(Ag_{x/2}Pb_{1-x}Bi_{x/2})$ Te, if the Pb component is partially substituted by Sn, thus obtaining a mixed-crystal series according to the invention, for example the mixed-crystal $(Ag_{0.3}Pb_{0.25}Sn_{0.15}Bi_{0.3})$ Te. In both cases the heat conductance increases with increasing Sn content.

It is remarkable, however, that despite increasing heat conductance, the mixed-crystal systems according to the invention can be doped with tellurium to assume by far higher values of electric conductance than the known systems. For that reason, the ratio $\sigma/\kappa$ and hence the effectivity of these mixed-crystal systems at comparable temperatures is also much higher.

While the application of zone-melting methods to mixed crystals of a single $A^{IV}B^{VI}$ compound with an $A^{I}B^{V}C_2^{VI}$ compound has encountered difficulties due to occurrence of foreign phase inclusions, such difficulties, contrary to expectation, have been found to be considerably reduced when producing mixed crystals according to the invention, despite the fact that the latter are composed of two $A^{IV}B^{VI}$ compounds and an $A^{I}B^{V}C_2^{VI}$ compound. It has also been discovered that surprisingly the mixed-crystals according to the invention can be more easily homogenized, for example by zone levelling. The novel mixed-crystals, in further distinction from those heretofore known, exhibit higher mechanical strength, are less brittle and are obtained as less heterogeneous products as a result of relatively simple production methods. The temperature constancy has also been found to be increased in comparison with the most closely similar known mixed-crystal systems.

Mixed-crystals according to the invention can be produced by melting them together from the individual components, preferably in a closed processing vessel under exclusion of oxygen or under vacuum, in the manner known generally for the production of intermetallic compounds and other mixtures. Furthermore, the mixed-crystals according to the invention can be pulled in the manner known for mono-crystals either from the melt or by zone-pulling methods. Mixed-crystals of the following compositions have been found particularly advantageous for use in thermoelectric semiconductor devices:

(1) $(Ag_{0.35}Pb_{0.15}Sn_{0.15}Sb_{0.35})$ Te
(2) $(Ag_{0.35}Pb_{0.15}Sn_{0.15}Bi_{0.35})$ Te

Reference to these particular mixed-crystals will be made in the following description in conjunction with the accompanying drawings in which FIG. 1 shows by way of example a thermopile whose individual legs 1 and 2 consist of mixed-crystals according to the invention having respectively different thermoforces. The members 1 and 2 may consist of one and the same mixed-crystal substance except that the members 1 are doped for p-type conductance and the legs 2 have n-type conductance. The legs are joined together by copper bars 3 and 4. The device of FIG. 1 is suitable, for example as a voltage generator. Similar devices are also applicable for cooling purposes. The choice of the materials for the thermocouple legs is in accordance with known principles and may include a material other than corresponds to the present invention for one of the two legs of each couple.

Plotted on the abscissa in FIG. 2 is the temperature in ° C. and on the ordinate the thermoelectric effectivity $z$ in $10^{-3}$ ° $K.^{-1}$. Curve 11 indicates the course of the effectivity $z$, computed from measurements of thermoforce $\alpha$, electric conductivity $\sigma$ and heat conductance $\kappa$ for the mixed-crystal $(Ag_{0.35}Pb_{0.15}Sn_{0.15}Sb_{0.35})$ Te. For comparison, the curve 12 represents the effectivity $z$ of the mixed crystal $(Ag_{0.35}Pb_{0.30}Sb_{0.35})$ Te, disclosed in the above-mentioned copending application Serial No. 856,-087.

When producing the mixed-crystal $(Ag_{0.35}Pb_{0.15}Sn_{0.15}Sb_{0.35})$ Te according to the invention, it is of advantage to take the peritectic character of the $AgSbTe_2$ into account by adding to the otherwise stoichiometric quantities of the substances a slight excess of $Sb_2Te_3$. An excess in the amount of 0.5 mole percent is preferably used, resulting for example, in the following weighed-in quantities of elemental components:

5.2543 g. Ag
6.2792 g. Sb
18.4640 g. Te+100 mg.
4.4525 g. Pb
8.8579 g. Sn

The excess amount of 100 mg. Te is added for maintaining the Te-equilibrium vapor pressure at the melting temperature of about 570° C. and also for doping purposes. The degree of purity of the starting elements is 99.999% The starting materials, preferably in pulverulent form, are placed into a quartz boat whose inner walls are carbonized by coating it twice with xylol and then burning the xylol, each time leaving a carbon coating. The elongated quartz boat with its contents is placed into a quartz ampule which is thereafter evacuated down to the pressure of $10^{-1}$ mm. Hg and heated to the melting temperature of about 570° C. Thereafter the melt is permitted to cool and crystallize and is subsequently homogenized by zone pulling. For this purpose, the rod-shaped product is preheated in the furnace to 520° C. and thereafter a melting zone at 2.5 cm. axial width is pulled lengthwise through the rod once in forward and reverse direction at a speed of 0.48 mm. per minute. Thereafter, the homogenized rod is tempered for 20 hours at 520° C.

The effectivity curve 11 in FIG. 2 was obtained from measurements made with mixed-crystal material produced in the above-described manner.

FIG. 3 represents the thermoelectric effectivity $z$ of the mixed-crystal according to the invention $(Ag_{0.35}Pb_{0.15}Sn_{0.15}Bi_{0.35})$Te (by curve 21) in comparison with the corresponding effectivity curve 22 of the mixed-crystal $(Ag_{0.35}Pb_{0.30}Bi_{0.35})$Te When producing the just mentioned mixed-crystal according to the invention from its elemental components, it is preferable to take the peritectic character of the $AgBi_2Te_3$ into account by adding a slight excess of 0.5 mole percent $Bi_2Te_3$, the exact amount of the excess being not critical because of the subsequent zone-pulling treatment but said excess should remain below about 1 mole percent. The following total amount of weighed starting quantities can thus be used:

5.0644 g. Ag
10.3888 g. Bi
17.7970 g. Te+50 mg.
4.2916 g. Pb
2.4584 g. Sn

These materials are used in pulverulent form with at least 99.999% purity. They are melted in vacuum and subsequently homogenized by zone levelling in the same manner as described with reference to the foregoing example.

Curve 21 in FIG. 3 was obtained from measurements made with a product produced in this manner. In contrast to the first mentioned example, the effectivity of the Sn-containing mixed-crystals products according to curve 21 in FIG. 3 decreases at a greater rate with increasing temperature than the mixed-crystal not having the Sn-component and represented by curve 22. It will be recognized that for increasing the effectivity at high temperature the Sn proportion in the mixed-crystal system according to the invention $$(Ag_{x/2}Pb_{(1-x)(1-y)}Sn_{(1-x)y}Bi_{x/2})Te$$

must not be made too large. However, if it is desired to obtain high effectivity values at low temperatures (Peltier effect), the reverse holds true.

Particularly favorable mixed-crystal materials for thermoelectric purposes have also been ascertained to correspond to the formula $$(Ag_{x/2}Pb_{(1-x)(1-y)}Ge_{(1-x)y}Sb_{x/2})Te$$

Superior results as to thermoelectric properties were found in such mixed-crystals when the value of $x$ was between 0.35 and 0.75 and the value of $y$ between 0.2 and 0.8, as is more fully disclosed and claimed in the application of J. Rupprecht, filed concurrently herewith (F–2385).

I claim:

1. A semiconductor body constituted by a mixed-crystal of the formula $$(A^{I}_{x/2}\, B^{IV}_{(1-x)(1-y)}\, C^{IV}_{(1-x)y}\, D^{V}_{x/2})\, E^{VI}$$

wherein $A^I$ denotes silver, $B^{IV}$ and $C^{IV}$ denote respectively lead and tin, $D^V$ denotes substance selected from the group consisting of antimony and bismuth, $E^{VI}$ denotes substance selected from the group consisting of selenium and tellurium, and $0.35<x<0.95$, $0.05<y<0.95$.

2. A semiconductor body constituted by a mixed-crystal of silver, lead, tin, antimony and tellurium in substantially the atomic proportions $(Ag_{0.35}Pb_{0.15}Sn_{0.15}Sb_{0.35})Te$.

3. A semiconductor body constituted by a mixed-crystal of silver, lead, tin, bismuth and tellurium in substantially the atomic proportions $(Ag_{0.35}Pb_{0.15}Sn_{0.15}Bi_{0.35})Te$.

4. The method of producing a semiconductor body, which comprises melting in a closed vessel the constituents:

$$(A^{I}_{x/2}\, B^{IV}_{(1-x)(1-y)}\, C^{IV}_{(1-x)y}\, D^{V}_{x/2})\, E^{VI}$$

wherein $A^I$ denotes silver, $B^{IV}$ and $C^{IV}$ denote respectively lead and tin, $D^V$ denotes substance selected from the group consisting of antimony and bismuth, $E^{VI}$ denotes substance selected from the group consisting of selenium and tellurium, and $0.35<x<0.95$, $0.05<y<0.95$, the melting being effected with substantially stoichiometric quantities of said constituents, and thereafter permitting the melt to crystallize.

5. The method of producing a semiconductor body, which comprises melting in a closed vessel the constituents:

$$(A^{I}_{x/2}\, B^{IV}_{(1-x)(1-y)}\, C^{IV}_{(1-x)y}\, D^{V}_{x/2})\, E^{VI}$$

wherein $A^I$ denotes silver, $B^{IV}$ and $C^{IV}$ denote respectively lead and tin, $D^V$ denotes substance selected from the group consisting of antimony and bismuth, $E^{VI}$ denotes substance selected from the group consisting of selenium and tellurium, and $0.35<x<0.95$, $0.05<y<0.95$, the melting being effected with substantially stoichiometric quantities of said constituents, permitting the melt to crystallize, and subjecting the crystalline product to zone melting.

6. The method of producing a semiconductor body, which comprises melting in a closed vessel the constituents:

$$(A^{I}_{x/2}\, B^{IV}_{(1-x)(1-y)}\, C^{IV}_{(1-x)y}\, D^{V}_{x/2})\, E^{VI}$$

wherein $A^I$ denotes silver, $B^{IV}$ and $C^{IV}$ denote respectively lead and tin, $D^V$ denotes substance selected from the group consisting of antimony and bismuth, $E^{VI}$ denotes substance selected from the group consisting of selenium and tellurium, and $0.35<x<0.95$, $0.05<y<0.95$, the melting being effected with substantially stoichiometric quantities of said constituents, and converting the resulting polycrystalline product into a monocrystal.

References Cited by the Examiner

Wernick: "Metallurgy of Some Ternary Semiconductors and Constitution of the $AgSbSe_2$-$AgSbTe_2$-$AgBiSe_2$-PbSe-PbTe System," article in Properties of Elemental and Compound Semiconductors, edited by Gatos, Interscience Publishers, New York, 1960, page 81.

TOBIAS E. LEVOW, *Primary Examiner.*

MAURICE A. BRINDISI, *Examiner.*